(12) United States Patent
Domenicucci et al.

(10) Patent No.: US 7,102,145 B2
(45) Date of Patent: Sep. 5, 2006

(54) SYSTEM AND METHOD FOR IMPROVING SPATIAL RESOLUTION OF ELECTRON HOLOGRAPHY

(75) Inventors: Anthony G. Domenicucci, New Paltz, NY (US); Yun-Yu Wang, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 22 days.

(21) Appl. No.: 10/972,696

(22) Filed: Oct. 25, 2004

(65) Prior Publication Data

US 2006/0097167 A1    May 11, 2006

(51) Int. Cl.
*G01N 23/04* (2006.01)

(52) U.S. Cl. .................. 250/492.1; 250/307; 250/306; 250/311; 257/14; 257/10; 257/9; 257/28; 257/30; 438/3; 438/105

(58) Field of Classification Search ...................... None
See application file for complete search history.

(56) References Cited

U.S. PATENT DOCUMENTS

| | | | |
|---|---|---|---|
| 5,192,867 A | | 3/1993 | Osakebe et al. |
| 6,573,501 B1 | * | 6/2003 | Kaneyama et al. .......... 250/311 |
| 6,617,580 B1 | * | 9/2003 | Voelkl ......................... 250/311 |
| 6,759,656 B1 | * | 7/2004 | Tomita ......................... 250/311 |

OTHER PUBLICATIONS

Y. Y. Wang et al.; "Variable Magnification of Electron Holography for Junction Profiling of Semiconductor Devices with Dual Lens System on JEOL JEM-2010F;" JOEL News vol. 39, No. 1; 6(2004); pp. 6-9.
Y. Y. Wang et al; "Off-axis electron holography with a dual-lens imaging system and its usefulness in 2-D potential mapping of semiconductor devices;" found at www.sciencedirect.com.

* cited by examiner

*Primary Examiner*—Jack Berman
*Assistant Examiner*—Zia R. Hashmi
(74) *Attorney, Agent, or Firm*—Lisa U. Jaklitsch; Cantor Colburn LLP

(57) ABSTRACT

A method for enhancing spatial resolution of a transmission electron microscopy TEM) system configured for electron holography. In an exemplary embodiment, the method includes configuring a first lens to form an initial virtual source with respect to an incident parallel beam, the initial virtual source positioned at a back focal plane of said first lens. A second lens is configured to form an intermediate virtual source with respect to the incident parallel beam, the position of said intermediate virtual source being dependent upon a focal length of the first lens and a focal length of the second lens. A third lens is configured to form a final virtual source with respect to the incident parallel beam, wherein the third lens has a focal length such that a front focal plane of the third lens lies beyond the position of the intermediate virtual source, with respect to a biprism location.

18 Claims, 14 Drawing Sheets

100 nm

SYSTEM AND METHOD FOR IMPROVING SPATIAL RESOLUTION OF ELECTRON HOLOGRAPHY

BACKGROUND

The present invention relates generally to material specimen inspection techniques, and, more particularly, to a system and method for improving spatial resolution of electron holography.

Advancements in Transmission Electron Microscopy (TEM) technology enable materials to be analyzed at near atomic resolution by providing high-magnification, high-resolution imaging and analysis capabilities. TEM enables scientists to gather information relating to a material's physical properties, such as its microstructure, crystalline orientation and elemental composition. This information has become increasingly important as the need for advanced materials for use in areas such as microelectronics and optoelectronics, biomedical technology, aerospace, transportation systems and alternative energy sources, among others, increases.

TEM is accomplished by examining material specimens under a transmission electron microscope. In a transmission electron microscope, a series of electromagnetic lenses direct and focus an accelerated beam of electrons, emitted from an electron gun contained within the microscope, at the surface of a specimen. Electrons transmitted through the specimen yield an image of the specimen's structure, which provides information regarding its properties. In addition, elemental and chemical information is provided by both the transmitted electrons and the x-rays that are emitted from the specimen's surface as a result of electron interaction with the specimen.

In 1947, a Hungarian-British physicist named Dennis Gabor sought to find a way to sharpen the resolution of the images initially produced in transmission electron microscopes, which were in their infancy at the time. He proposed electron holography, a method of interference imaging in which the phase and amplitude components of the electron beam are separated to correct the spherical aberration of the microscope. In this regard, the electron beam source is split into the incident, undeviated electron wave (i.e., the reference wave) and the image wave (or object wave) diffracted by the specimen and exiting the bottom surface thereof. Assuming the electron optical geometry is correctly set up, these two waves can be made to interfere. The resulting interference pattern is then processed using optical techniques to form the holograms (images).

Unfortunately, the electron microscopes of Gabor's era did not produce an electron wave with sufficient coherence to permit the proper degree of interference required to make a useful hologram. More recently however, the development of TEMs using highly coherent field-emission electron sources has made electron holography a more effective undertaking. This technique has been shown to be particularly valuable for two-dimensional, p-n junction potential mapping of semiconductor devices with high spatial resolution. Such information is valuable for semiconductor device development and yield improvement.

Recent scaling in semiconductor device manufacturing down to sub-micrometer levels (e.g., about 20–100 nm gate length devices) warrants the implementation of two-dimensional electrical junction mapping at a high spatial resolution (e.g., less than 1 nm). In this regard, off-axis electron holography in a TEM has been successfully used to produce 2-D potential maps of semiconductor devices at a spatial resolution from which junction positions can be inferred. The potential maps are derived from phase information that is extracted from the interference pattern generated by overlapping electrons, which have passed through the semiconductor sample along with the electrons that have not.

As devices have continued to shrink, the corresponding electron holography parameters for effective inspection of the current generation of these semiconductor devices now include: an overlap width in the range of about 100 nm to about 1000 nm for an adequate field of view (FOV); a fringe spacing between about 0.1 nm to about 10 nm for meaningful spatial resolution; visibility of the fringe contrast of about 10% to about 30% for useful signal to noise ratio; and adjustability of both the overlap and the fringe spacing relative to the sample for flexibility. FIG. 1(a) is an electron hologram taken with no sample, illustrating the fringe width (which determines the FOV), while FIG. 1(b) is an enlarged view of the highlighted portion of FIG. 1(a), particularly illustrating the fringe spacing (which determines the spatial resolution).

The implementation of previous approaches to off-axis electron holography (i.e., utilizing a single objective lens) has resulted in a trade off between fringe width (FOV) and fringe spacing. For example, if the overlap width was satisfactory, the fringe spacing was unsatisfactory and vice versa. Accordingly, it has now desirable to be able to independently control the various electron holography parameters, such as overlap and fringe spacing, for adequate inspection of increasingly scaled down semiconductor devices.

SUMMARY

The foregoing discussed drawbacks and deficiencies of the prior art are overcome or alleviated by a method for enhancing spatial resolution of a transmission electron microscopy (TEM) system configured for electron holography. In an exemplary embodiment, the method includes configuring a first lens to form an initial virtual source with respect to an incident parallel beam, the initial virtual source positioned at a back focal plane of said first lens. A second lens is configured to form an intermediate virtual source with respect to the incident parallel beam, the position of said intermediate virtual source being dependent upon a focal length of the first lens and a focal length of the second lens. A third lens is configured to form a final virtual source with respect to the incident parallel beam, wherein the third lens has a focal length such that a front focal plane of the third lens lies beyond the position of the intermediate virtual source, with respect to a biprism location.

In another embodiment, a method for creating an image of a sample object using a transmission electron microscopy (TEM) system configured for electron holography includes configuring a first lens to form an initial virtual source with respect to an incident parallel electron beam, the initial virtual source positioned at a back focal plane of said first lens. A second lens is configured to form an intermediate virtual source with respect to the incident parallel electron beam, the position of the intermediate virtual source being dependent upon a focal length of the first lens and a focal length of the second lens. A third lens is configured to form a final virtual source with respect to the incident parallel electron beam, wherein the third lens has a focal length such that a front focal plane of the third lens lies beyond the position of the intermediate virtual source, with respect to a biprism location. A voltage to the biprism so as to focus a holographic image on an image plane.

In still another embodiment, a system for enhancing spatial resolution of a transmission electron microscopy (TEM) system configured for electron holography includes a first lens configured to form an initial virtual source with respect to an incident parallel beam, the initial virtual source positioned at a back focal plane of said first lens. A second lens is configured to form an intermediate virtual source with respect to the incident parallel beam, the position of the intermediate virtual source being dependent upon a focal length of the first lens and a focal length of the second lens. A third lens is configured to form a final virtual source with respect to the incident parallel beam, wherein the third lens has a focal length such that a front focal plane of the third lens lies beyond the position of the intermediate virtual source, with respect to a biprism location.

BRIEF DESCRIPTION OF THE DRAWINGS

Referring to the exemplary drawings wherein like elements are numbered alike in the several Figures.

DETAILED DESCRIPTION

Disclosed herein is a system and method for enhancing the spatial resolution of electron holography, such as applied in TEM inspection of semiconductor devices. Briefly stated, a tri-lens holography system is implemented to allow fringe width and spacing relative to the sample object to be varied roughly independently from the fringe contrast, resulting in enhanced resolution and sensitivity. Moreover, the addition of a third "weak" lens allows the positioning of a virtual image of a source further away from the lens, to improve the fringe spacing from about 1.0 nm (using a dual-lens system) down to about 0.1 nm, as described in greater detail hereinafter.

Figure 1A:
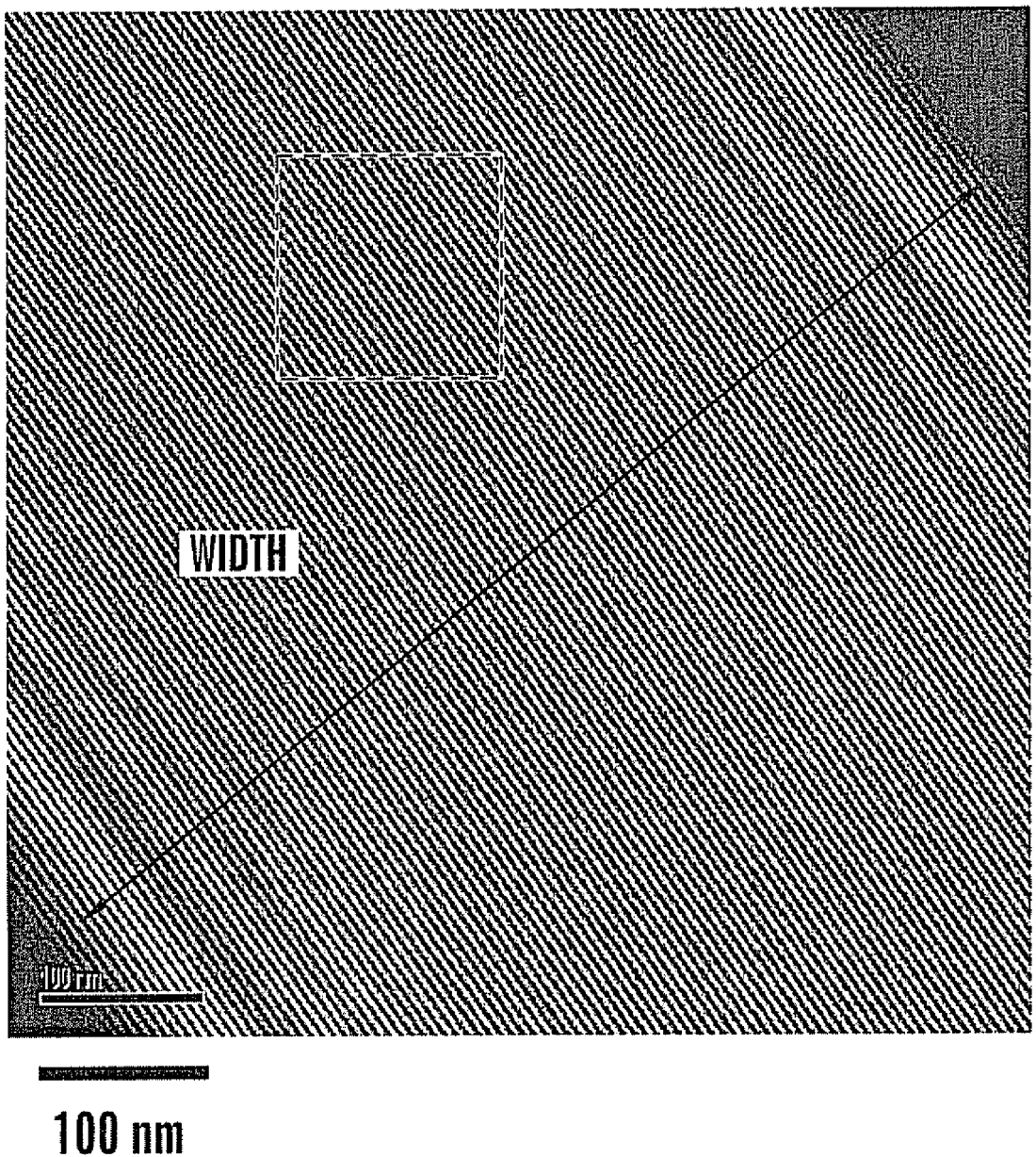
FIG. 1(a) is an electron hologram taken with no sample, illustrating the fringe width parameter.
Figure 1B:
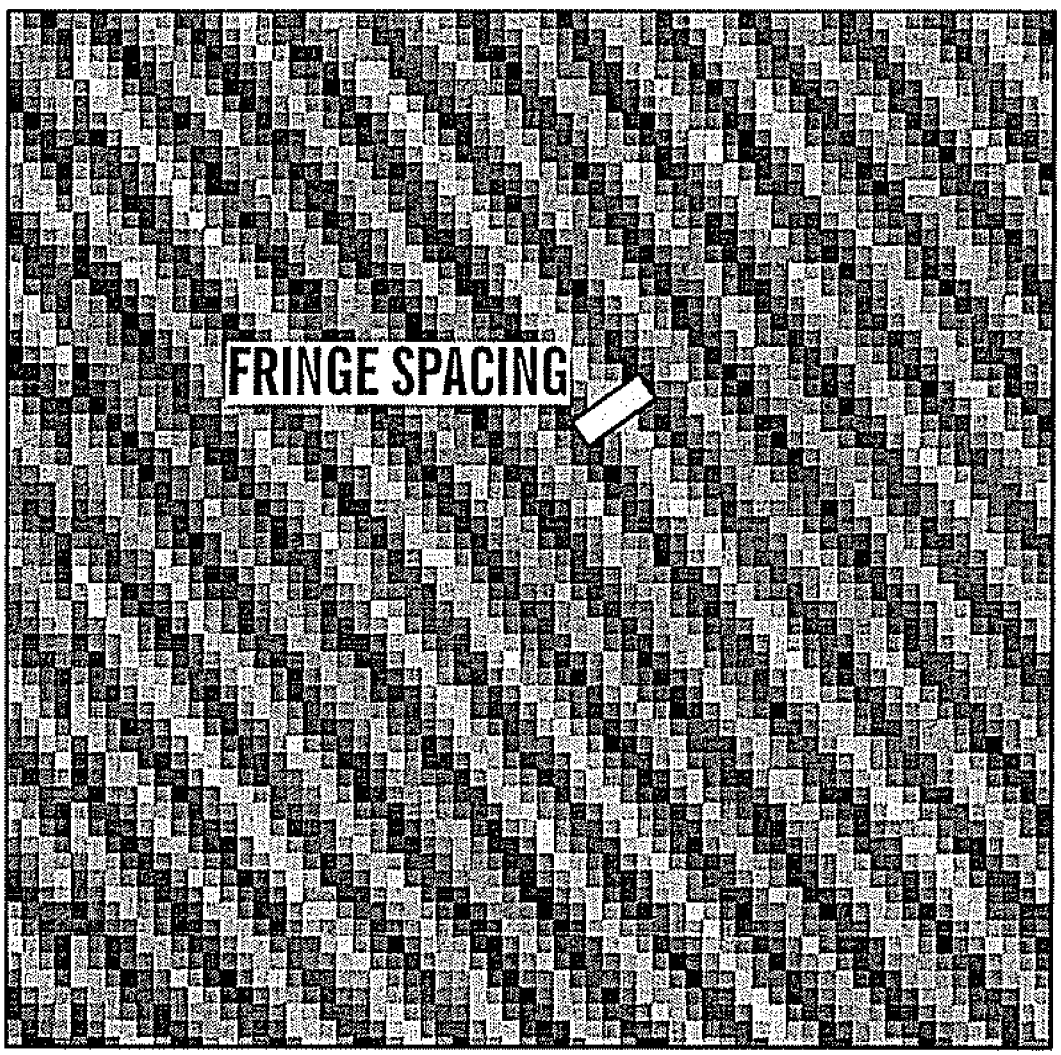
FIG. 1(b) is an enlarged view of the highlighted portion of FIG. 1(a), particularly illustrating the fringe spacing parameter.
Figure 2A:
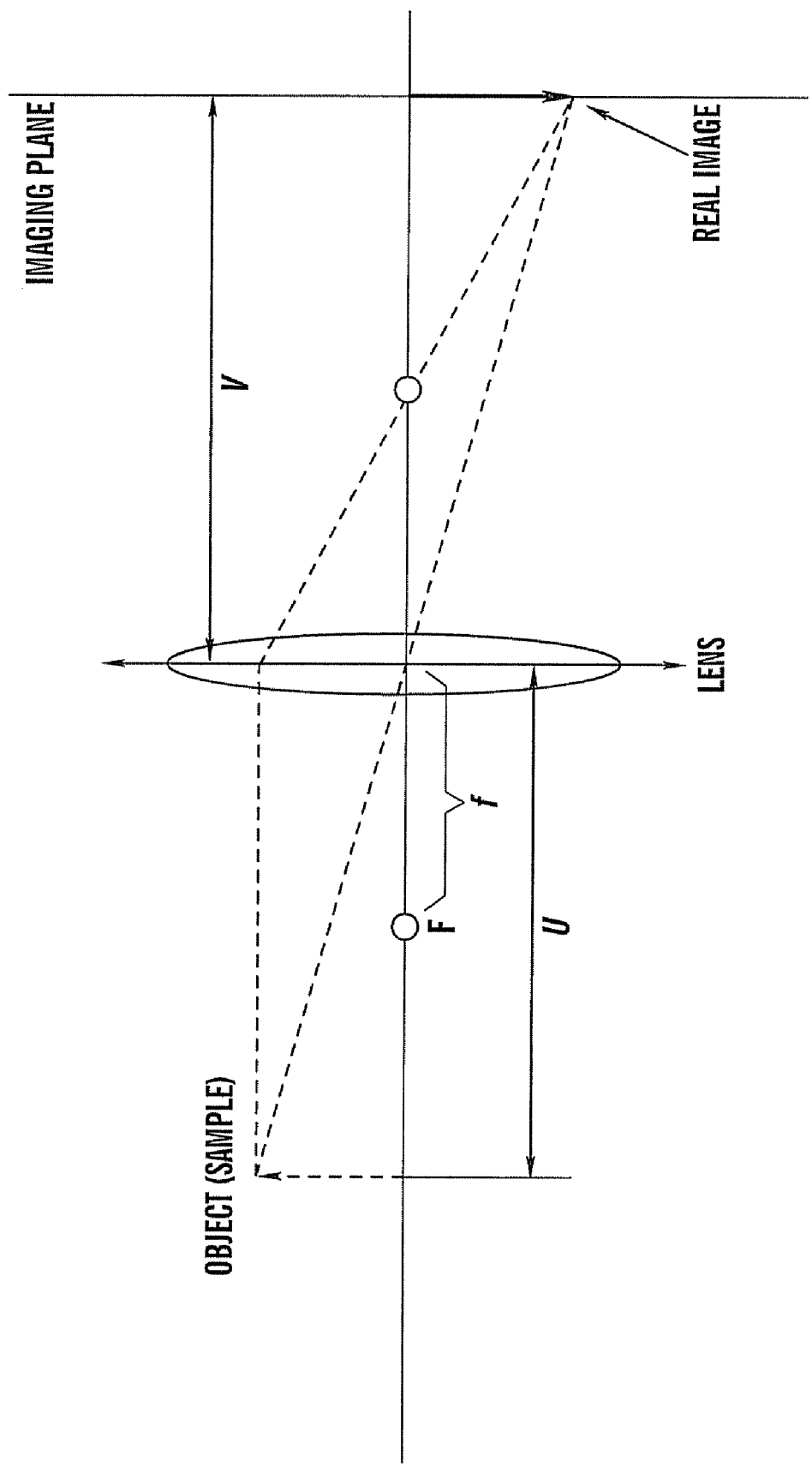
FIGS. 2(a) and 2(b) are ray diagrams that illustrate the relationship between object and image position for a single lens system.
Figure 2B:
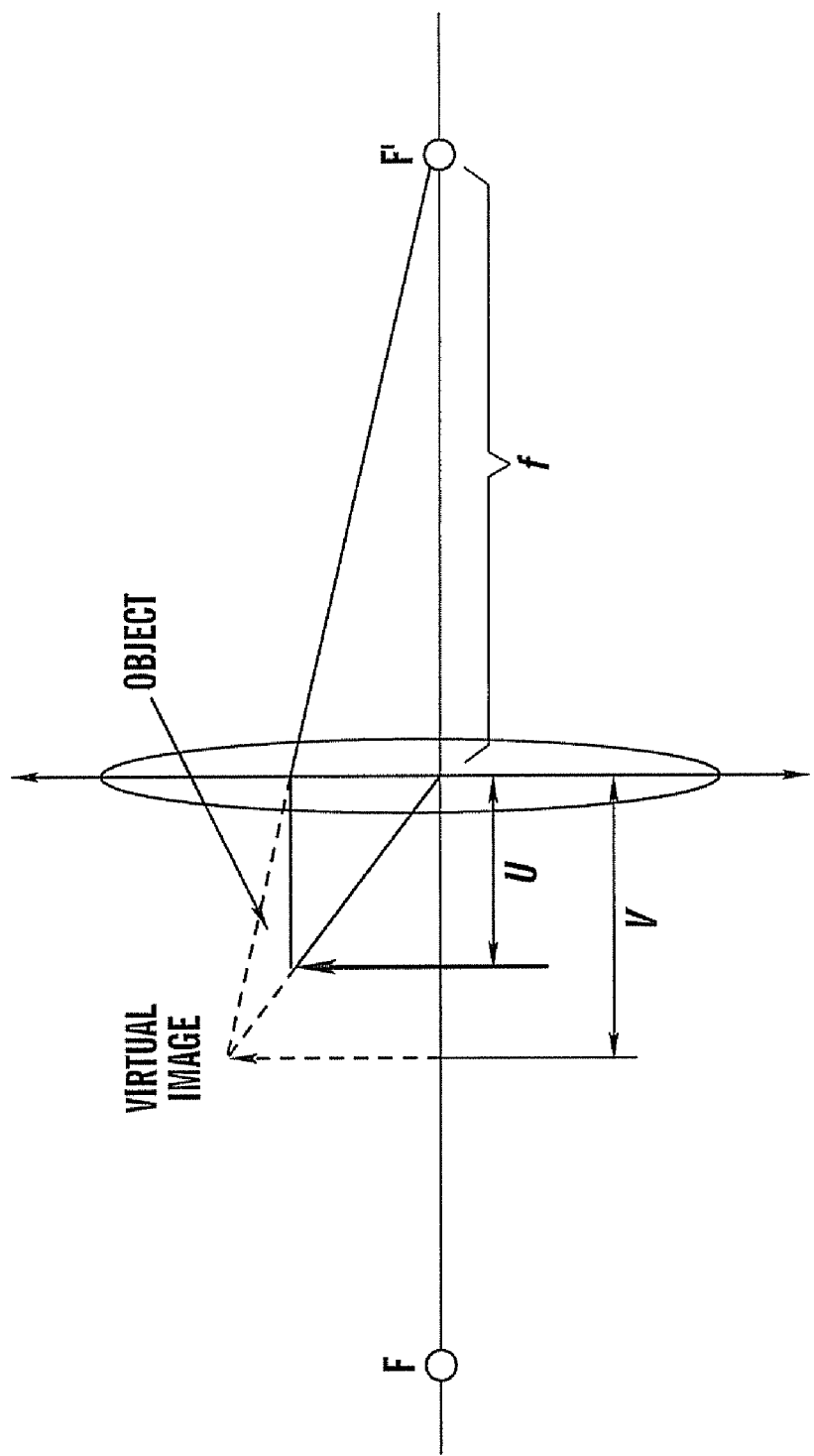

The principles of the invention embodiments described herein are perhaps best understood by initial consideration of certain general principles of electron optics and off-axis holography. FIGS. 2(a) and 2(b) are ray diagrams that illustrate the relationship between object and image position for a single lens system. This relationship is given by:

$$\frac{1}{u} + \frac{1}{v} = \frac{1}{f} \quad \text{(Eq. 1)}$$

where f is the focal length of the lens and u and v are the distances from the lens to the object and the image, respectively. If the object is before the lens, then u>0, otherwise u<0 if the object is behind the lens. Likewise, if the imaging position is before the lens, then v<0, and if the imaging position is behind the lens, then v>0. For this single lens system, therefore, three imaging possibilities exist. If the object is positioned outside of the first focal point of the lens (u>f>0), a real image is formed behind the lens and behind the second focal point (v>f>0). Depending upon the distance between the lens and the object, the image can either be magnified or demagnified. As the object moves closer to the first focal point, the magnification increases and the focal position of the projected real image moves further behind the lens. The ray diagram for this condition is specifically shown in FIG. 2(a).

On the other hand, if the object is between the first focal point and the lens (f>u>0), a magnified virtual image is formed and the virtual image position is further away from the lens than the object (v<−u<0). If the first focal point moves closer to the object, the magnification of the virtual image increases and the position of the virtual images moves further from the lens. The ray diagram for this condition is specifically shown in FIG. 2(b). Lastly, if the object were behind the lens (u<0), a demagnified image would be formed between the lens and the second focal point (f>v>0) (not illustrated).

The magnification (M) of a single lens is given by:

$$M = \text{abs}\left(\frac{v}{u}\right) = \text{abs}\left(\frac{f}{f-u}\right) \quad \text{(Eq. 2)}$$

For the specific type magnetic lenses used in electron optics, the focal length is related to the lens voltage in accordance with the following equation:

$$f = \frac{CR^2}{V^2} \quad \text{(Eq. 3)}$$

wherein C is a constant for a given lens, R is the resistance of the lens coil, and V is the voltage applied to the lens. Since all magnetic lenses are of the converging type, f is always positive. When the voltage of the lens is zero, its focal length becomes infinite. Thus, increasing the voltage of the lens (i.e., increasing the strength of the lens) decreases its focal length.

Figure 3A:
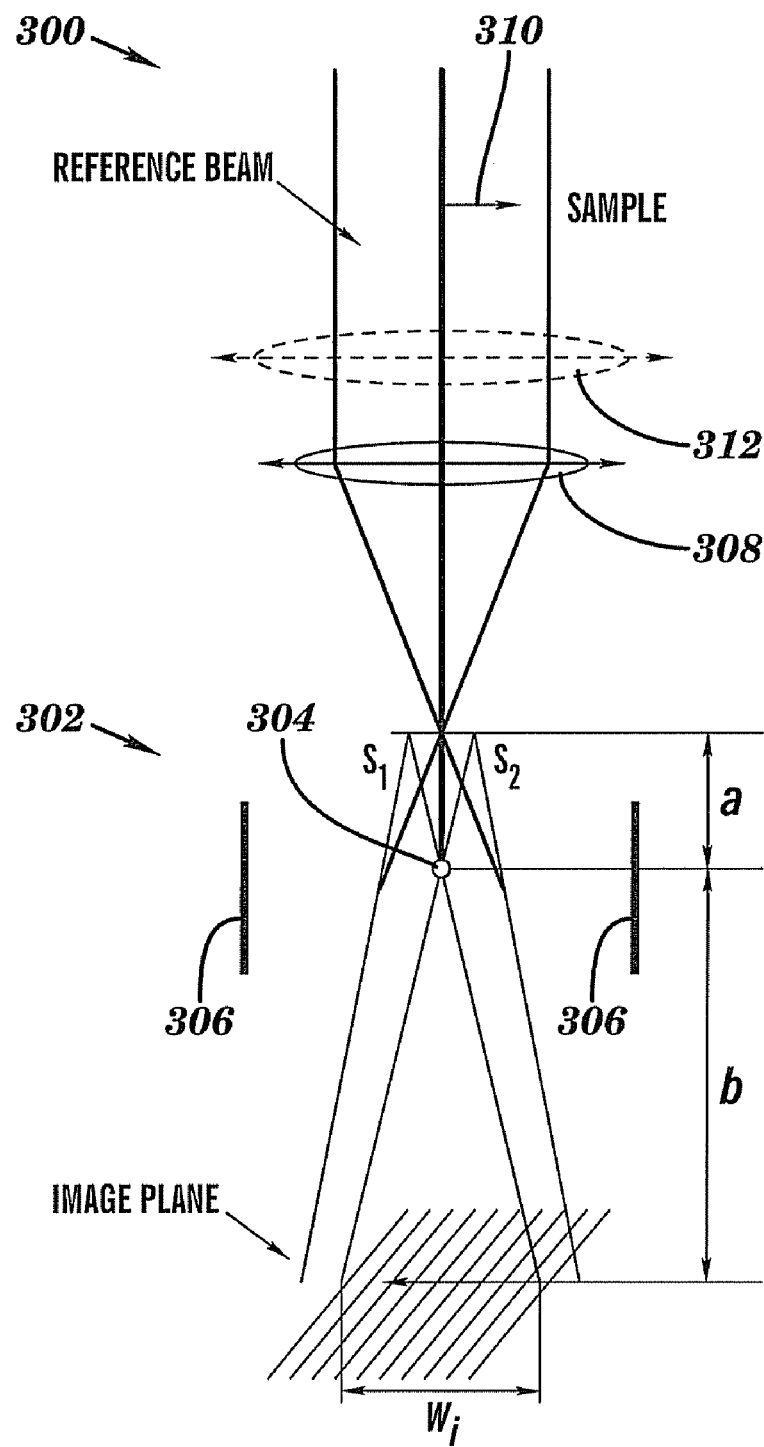
FIGS. 3(a) and 3(b) illustrate a schematic diagram of a portion of an exemplary electron microscope suitable for use in accordance with an embodiment of the invention.
Figure 3B:
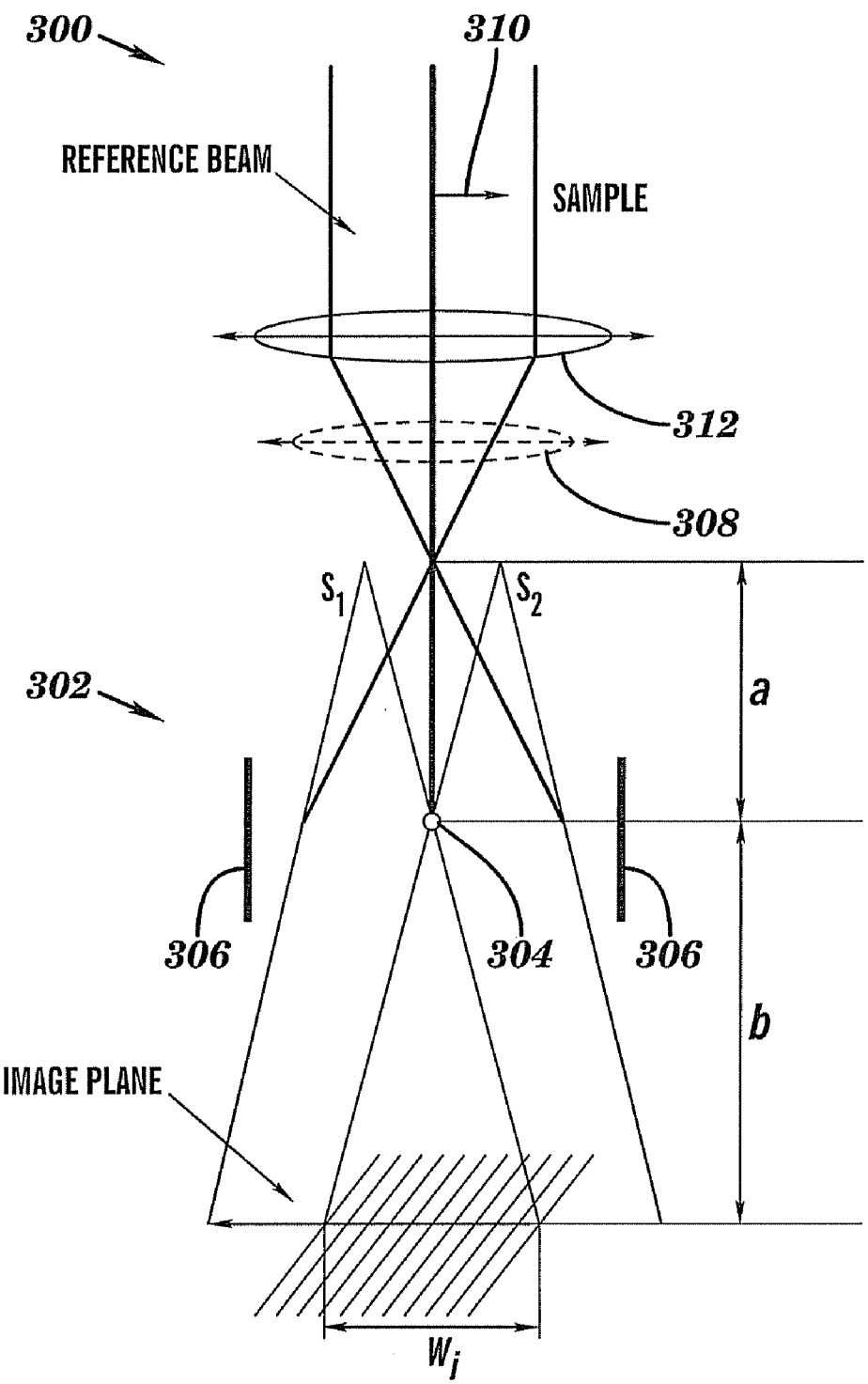

Referring now to FIGS. 3(a) and 3(b), a schematic diagram of a portion of an exemplary electron microscope 300 is illustrated. The electron microscope 300 is equipped with an electric biprism 302 for generating holograms, wherein the width of the overlap, the interference fringe spacing, and the fringe contrast are the key holographic parameters that determine the field of view, resolution, and sensitivity of the resultant potential maps. In order to form the electron holograms, a positive voltage is applied to the filament portion 304 of the biprism 302, while the electrodes 306 are grounded, thereby causing one beam to split into two beams interfering with each other. The off-axis electron hologram interference pattern may be thought of as being formed from two virtual sources, $S_1$ and $S_2$, of finite size ($\delta$) positioned above the biprism and separated by a distance d. The fringe spacing, $\sigma_i$, and fringe width, $W_i$, at the image plane are given by the expressions:

$$\sigma_i = \frac{\lambda}{2\gamma_0 V_b}\left(1 + \frac{b}{a}\right) \quad \text{(Eq. 4)}$$

and $$W_i = 2\gamma_0 V_b b - 2r_b\left(1 + \frac{b}{a}\right) \quad \text{(Eq. 5)}$$

wherein a is the distance between the virtual sources $S_1$, $S_2$, and the biprism (filament) position, b is the distance between image plane and the biprism position, $\lambda$ is the wavelength of the electron beam, $V_b$ is the biprism voltage, $\gamma_0$ is a constant related to microscope setup, and $r_b$ is the radius of the biprism filament. The fringe spacing, $\sigma_{obj}$, and width, $W_{obj}$, relative to the object, can be expressed as follows:

$$\sigma_{obj} = \sigma_i/M_{obj} \quad \text{(Eq. 6)}$$

and $$W_{obj} = W_i/M_{obj} \quad \text{(Eq. 7)}$$

where $M_{obj}$ is the magnification of the imaging lens(es). The above equations show that this magnification is a major factor that determines the fringe spacing and width relative to the object and hence a major factor in determining the FOV and spatial resolution of the hologram. As indicated previously, fringe contrast is another important parameter in electron holography and may be expressed by:

$$V_{fringe} = \frac{I_{max} - I_{min}}{I_{max} + I_{min}} = \frac{\sin(\beta)}{\beta} \quad \text{(Eq. 8)}$$

where $$\beta = \left(\frac{2\pi\delta}{\lambda}\right)\left(\frac{\gamma_0 b}{a+b}\right)V_b \quad \text{(Eq. 9)}$$

The fringe contrast, along with the electron dose, determines the minimum detectable voltage for the potential maps derived from electron holograms. Based on Eqs.(8) and (9), a larger applied biprism voltage leads to larger fringe width and smaller fringe spacing, both of which are preferred condition for most specimen analyses. On the other hand, the fringe contrast decreases with increased biprism voltage due to the finite size of the electron source, as also indicated by Eqs. (8) and (9). Thus, the control of fringe width, spacing, and contrast by varying only the biprism voltage limits the operational range of a TEM set up for electron holography. However, it will also be seen from Eqs. (6) and (7) that by continuously altering the magnification of imaging lenses, the fringe width ($W_{obj}$) and spacing ($\sigma_{obj}$) may be changed without significantly degrading fringe contrast, thereby widening the operational range for electron holography.

For a single imaging lens system, with both object position and image plane fixed, the only way to vary the magnification is by adjusting the lens position. As mentioned previously, if the lens is close to the object, the magnification is large; if the lens is far away from the object, then the magnification is small. Referring still to FIGS. 2(a) and 2(b), most commercial electron holography imaging systems utilize a single lens mode, even though they may be furnished with multiple objective lenses (e.g., only one of the two objective lenses is used at a time). In FIG. 3(a), the lower lens 308 (also referred to as the OM, or "Lorentz" lens) furthest away from the object 310 is used. Thus, the magnification is relatively small but the field of view is relatively large. In FIG. 3(b), the upper lens 312 (OL) closest to the object 310 is used to achieve a higher magnification. However, the fringe width is relatively small relative to the object, and the fringe spacing is too fine.

In U.S. patent application Ser. No. 10/755,081, filed on Jan. 9, 2004, the applicants of the present application have disclosed that by simultaneously operating two or more lenses, the magnification may be changed without changing the position of the lenses by varying the focal length of the lenses. More specifically, by using both the first lens (OL) and the second lens (OM), the image of the first lens acts as the object of the second lens, so long as the final image plane is situated below the biprism.

Figure 4:
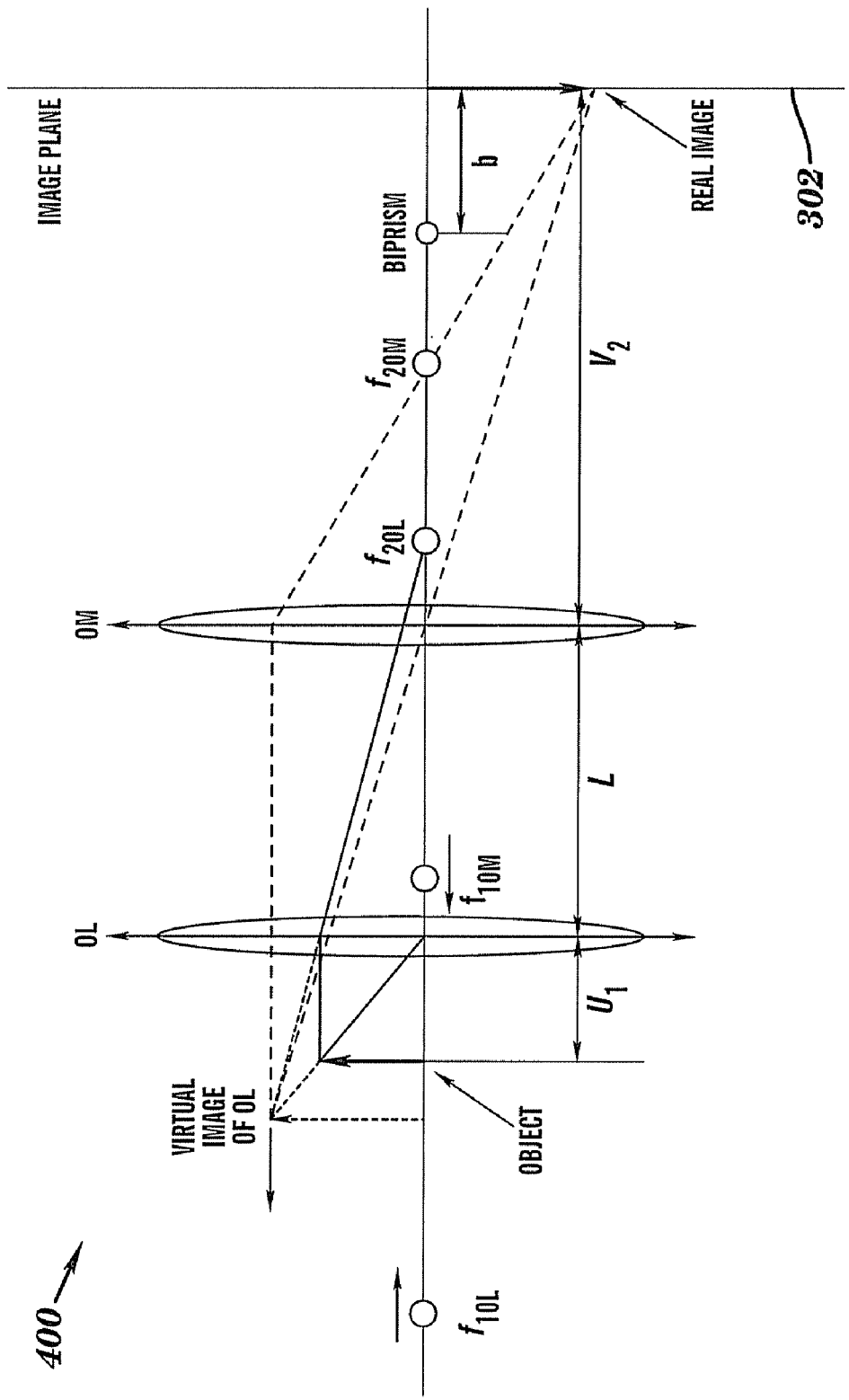
FIG. 4 is a ray diagram illustrating the combined operation of the objective lens (OL) and objective mini-lens (OM) of a dual-lens methodology and system.

FIG. 4 illustrates the combined operation of the objective lens (OL) and objective mini-lens (OM) that is the basis for the dual-lens methodology and system 300 disclosed in the '081 application. The voltage of the objective lens (OL) is set so that the position of the object is located behind the first focal point, $f_{1OL}$, but before the lens OL, thereby forming a virtual image of the object. The second objective lens (OM) is used to project a real image of the OL virtual image to the intermediate image plane 302 located beyond the biprism. As also shown in FIG. 4, when the focal point of OL ($f_{1OL}$) gets closer to the sample, the virtual image moves further away from the sample and become more magnified. In order to refocus the OL virtual image onto the same image plane 302, the focal length of OM is increased (i.e., the strength of OM is decreased) to compensate the movement of the virtual image position. Thus, the magnification of the sample at the image plane 302, $M_{obj}$, may be adjusted by varying the focal length of the first objective lens (OL) to yield a virtual image of variable size which is then refocused to the intermediate image plane by the objective mini-lens (OM).

Figure 5:
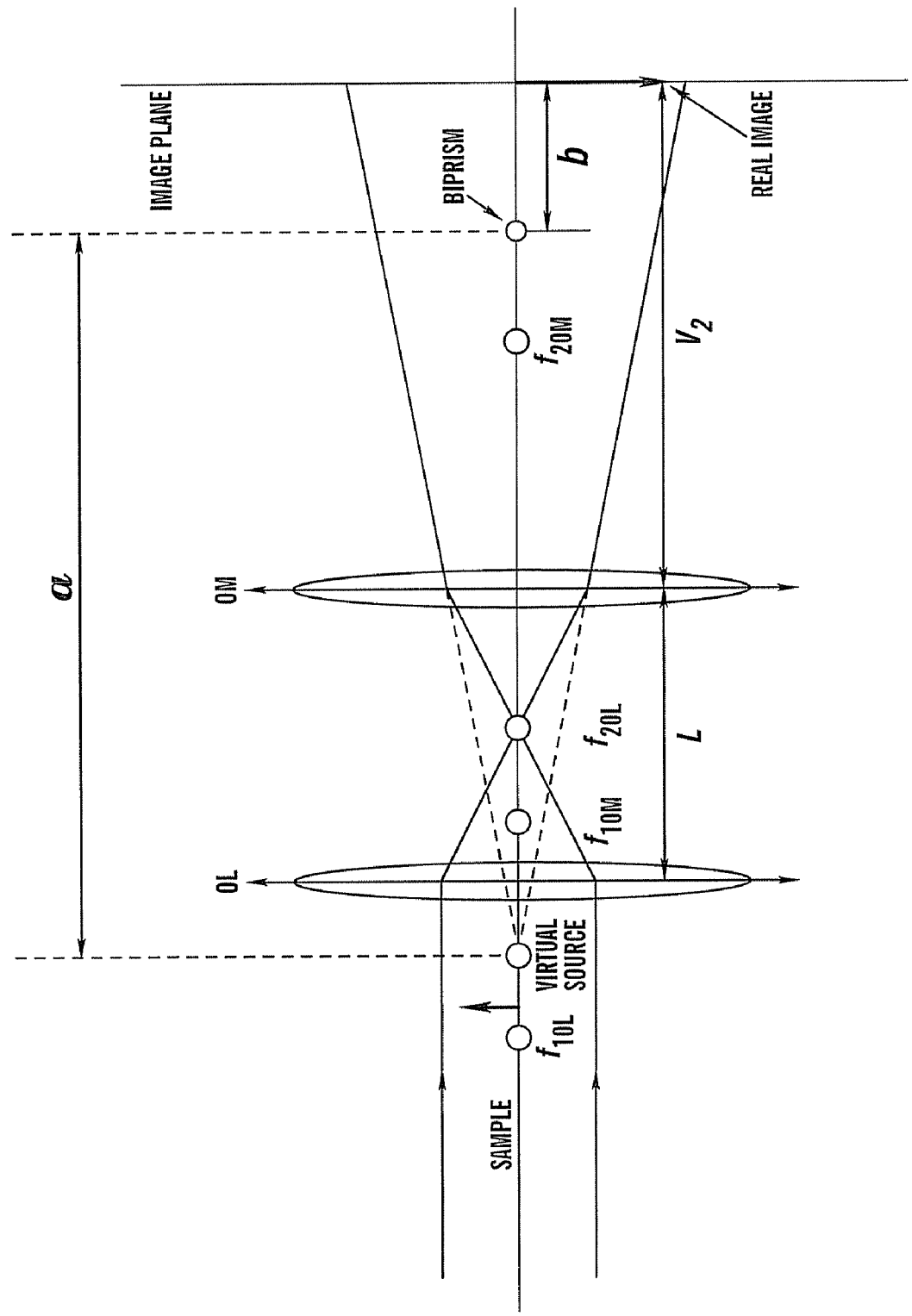
FIG. 5 is another ray diagram corresponding to the dual lens system of FIG. 4, particularly illustrating a parameter affecting fringe spacing.

As indicated in Eqs. (4), (5), (8) and (9), the location of the virtual source of electron holography is another significant parameter that ultimately determines the fringe spacing and fringe contrast. In a single lens operation with parallel beam illumination, the virtual source position is located at the back focal plane of the lens. However, with a dual lens system such as shown in FIG. 4, the location of the virtual source position depends on the relative position of the lenses and their focal lengths. As shown in FIG. 5, the distance "a" between the biprism and the virtual source is determined by the projection action of the objective mini-lens OM (i.e., by the resulting distance between $f_{2OL}$ and $f_{1OM}$). Since "a" is variable in the dual lens mode, the fringe spacing, $\sigma_i$, will depend not only on the biprism voltage, $V_b$, but also on the specific OL and OM excitations.

Figure 6:
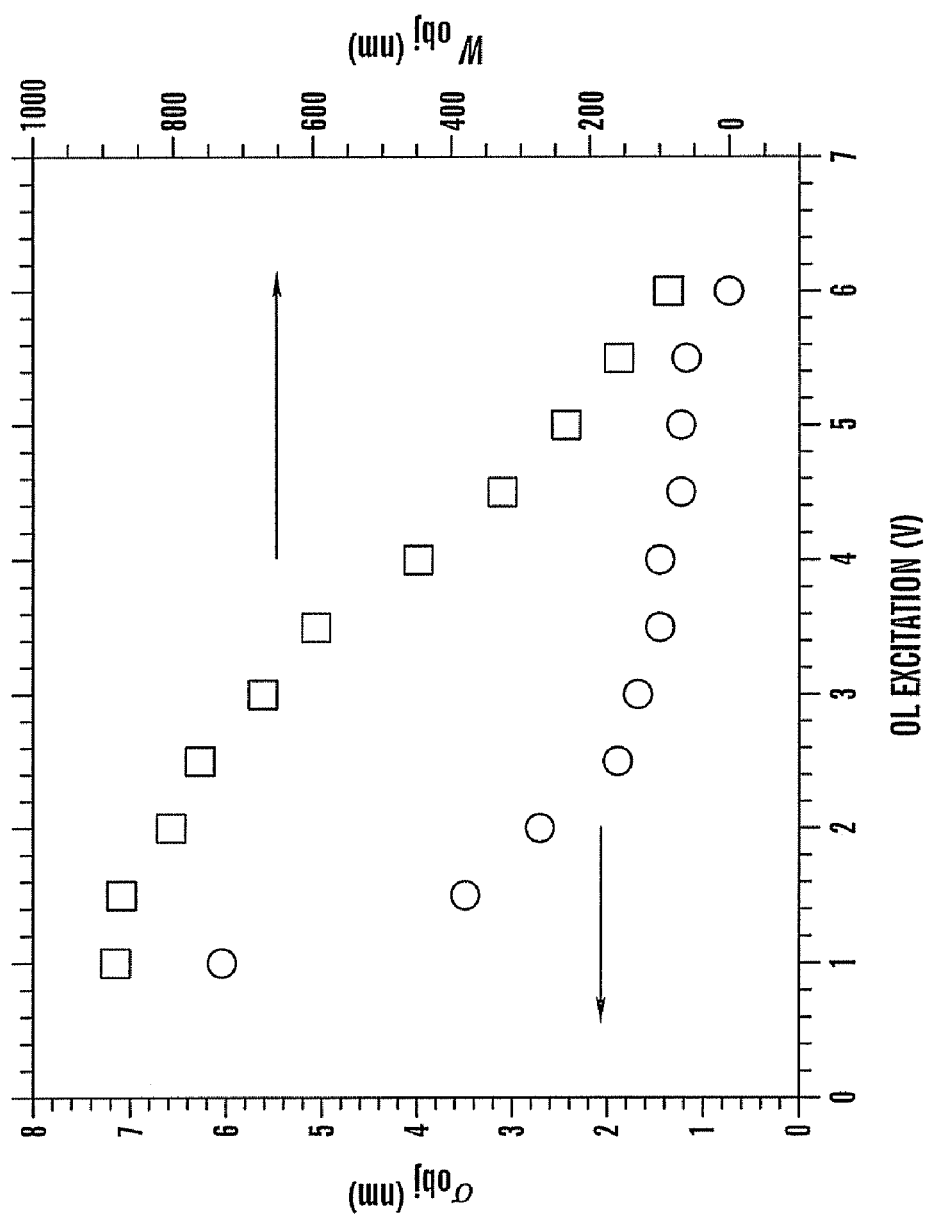
FIG. 6 is a graph that illustrates measured fringe spacing and width as a function of OL lens excitation voltage at a constant biprism voltage, for the dual lens system of FIG. 4.

FIG. 6 is a graph that illustrates measured fringe spacing and width as a function of OL lens excitation voltage at a constant biprism voltage (20V). As is shown, both the fringe spacing ($\sigma_{obj}$) and width ($W_{obj}$) decrease as the OL excitation voltage is increased, although at different rates. As the magnification of the dual lens is increased, the fringe width relative to the object decreases in accordance with Eq. (7). However, the fringe spacing depends not only on the magnification of the imaging system, but also on the distance a, even though there is a fixed image plane.

When the OL excitation voltage is below 3.0 volts, the rate of decreasing of fringe spacing with increasing OL voltage is faster than the rate of fringe width decrease. This is due to the fact that, in this operating region, the second focal point of OL ($f_{2OL}$) quickly approaches the first focal point of OM ($f_{1OM}$) with increasing OL, which results in a final virtual source location even further away from biprism, and thus a larger distance "a." However, once the OL excitation voltage is above 3.0 volts, in order to keep the final image plane at the same position, the subsequent increase in OL excitation voltage (reduction in the focal length of OL) causes to the first focal point of OM to move away from the second focal point of OL, which in turn results in a smaller distance "a." Therefore, even though the magnification is (significantly) reduced and the width of the interference pattern is also reduced with a higher OL excitation in this regime, the fringe spacing is not proportionally reduced, since the distance "a" becomes smaller with increasing OL excitation.

Figure 7:
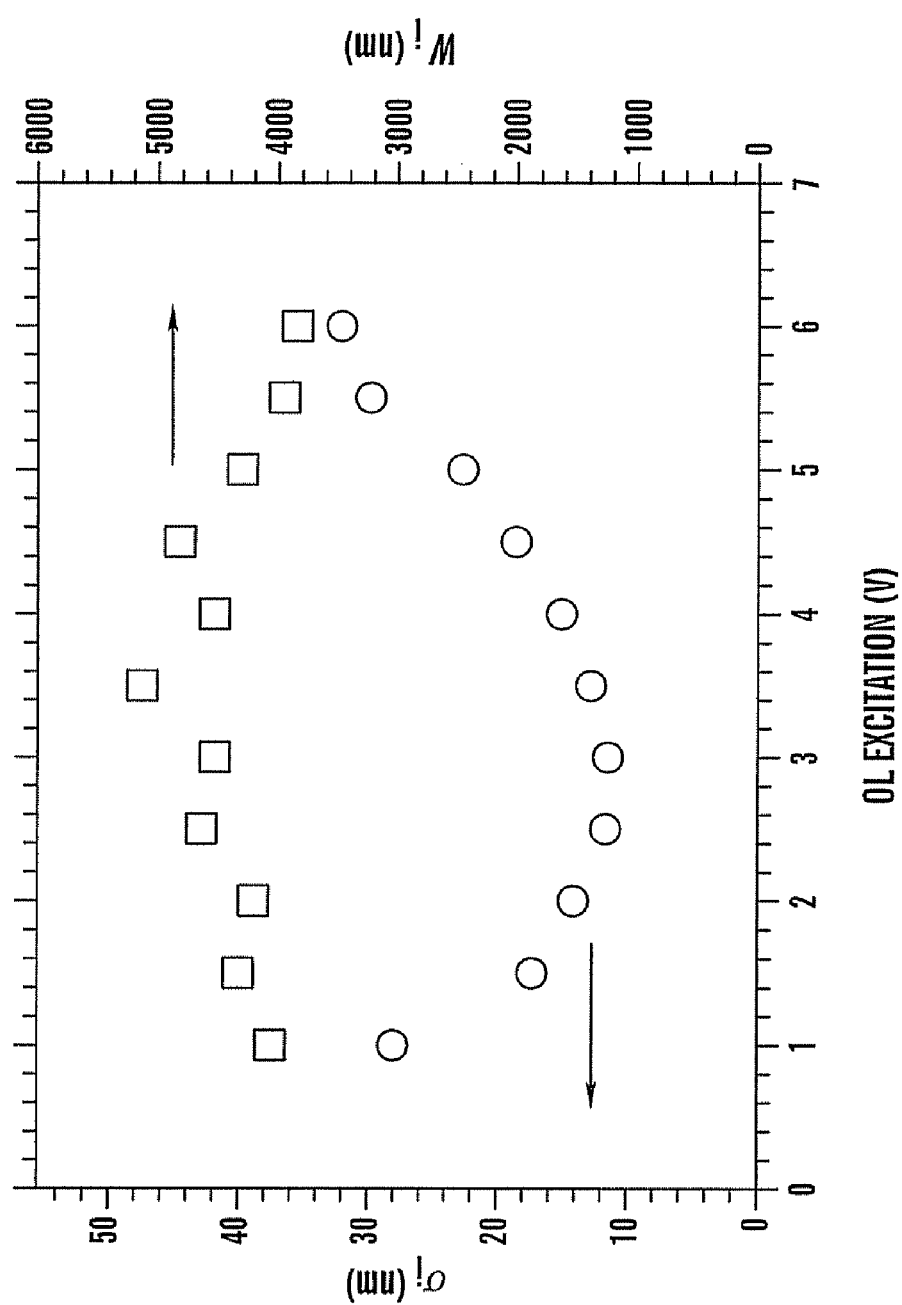
FIG. 7 is a graph that illustrates fringe spacing and width at the image plane ($\sigma_i$ and $W_i$) as a function of OL excitation.

The change of in the distance "a" becomes even more apparent with reference to the graph of FIG. 7, in which the fringe spacing and width at the image plane ($\sigma_i$ and $W_i$) are plotted against OL excitation, where $\sigma_i$ and $W_i$ are calculated from $\sigma_{obj}$ and $W_{obj}$ according to Eqs. (6) and (7). A minimum value of $\sigma_i$ can be seen in FIG. 6, wherein the distance "a" is at a maximum due to a resulting minimum distance between $f_{1OM}$ and $f_{2OL}$ at an excitation of about OL=3.0 volts. Because of the resulting movement of $f_{1OM}$ away from $f_{2OL}$ after OL is increased above 3.0 volts, the distance "a" becomes smaller again, which in turn creates greater fringe spacing.

Figure 8:
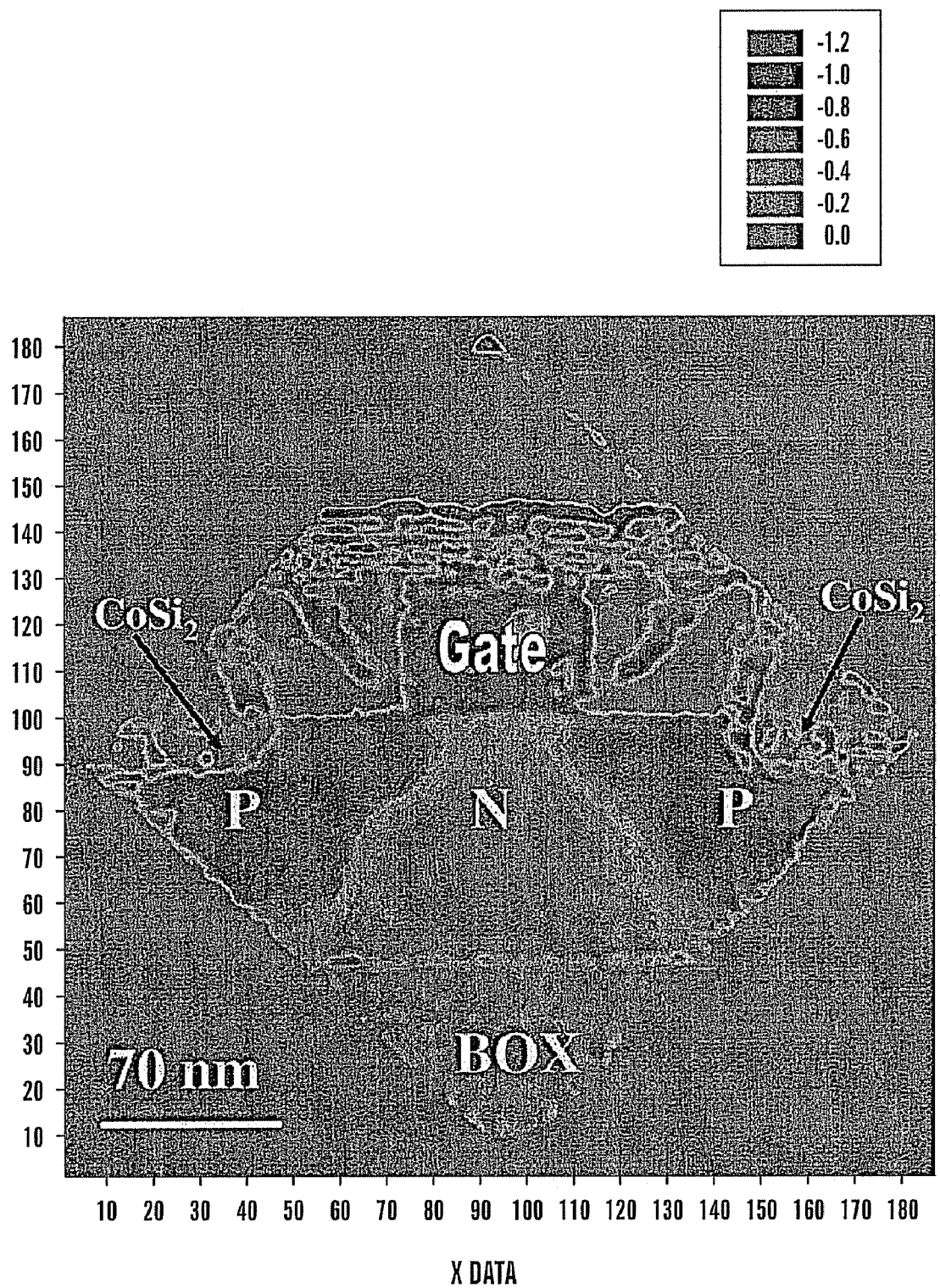
FIG. 8 is a pseudo-color potential map of a 70 nm, polysilicon PFET device formed on a silicon-on-insulator (SOI) substrate.

Notwithstanding the upper limit on the distance "a" in the dual lens method, such method provides a significant advantage over the traditional single lens approach, as further discussed in U.S. Ser. No. 10/755,081. FIG. 8 is a pseudo-color potential map of a 70 nm, polysilicon PFET device formed on a silicon-on-insulator (SOI) substrate. Both the fringe spacing and fringe width were successfully scaled with respect to a 220 nm device without loss of contrast by simply varying the OL excitation.

However, as indicated above, the continued scaling of semiconductor devices continues to drive the need for further reducing the lower boundary of the fringe spacing from 1.0 nm down to about 0.1 nm or less. In order to accomplish this, a solution to the upper limitation on the distance "a" as discussed in conjunction with the dual lens system is desired. Based on the above discussion, it has been determined that if there were a third "weak" lens between OM and the biprism, a first focal point of this third lens may be positioned closer to the virtual source position so as to form a virtual image of the virtual source that is separated away from the lens OL, and thereby increasing distance "a." With such an arrangement, a larger value of the distance "a" may be maintained, even at a high magnification condition, in order to reduce the fringe spacing at the same rate as the fringe width is reduced, in the regime of the OL excitation voltage above 3.0 volts. Moreover, the addition of a third weak lens would only affect the illumination condition, but would have very little effect on the magnification of the system.

Figure 9:
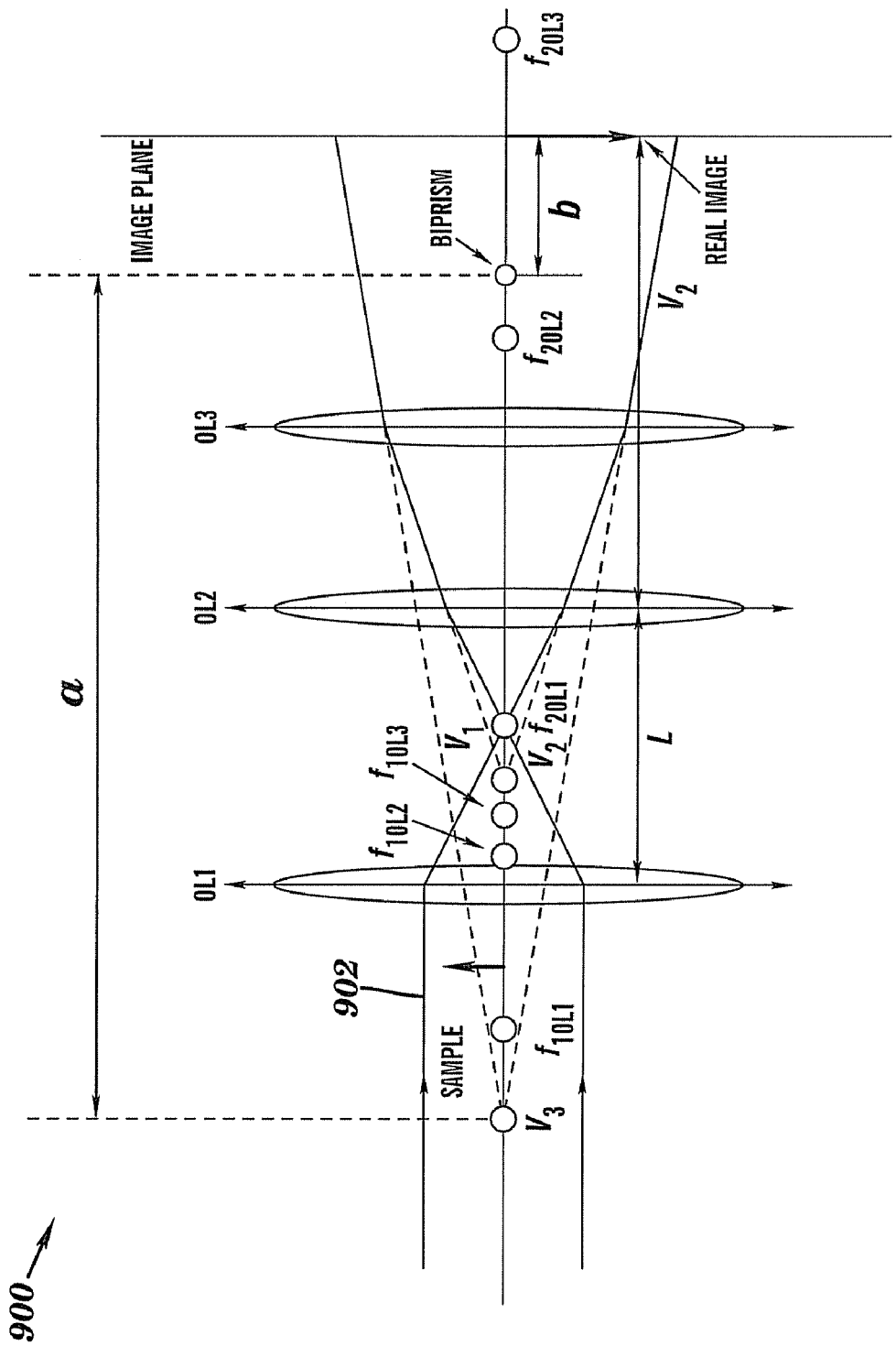
FIG. 9 is a ray diagram of a tri-lens system, in which a third, weaker lens placed behind the previously disclosed dual lens system, in accordance with an embodiment of the invention.

Therefore, in accordance with an embodiment of the invention, FIG. 9 is a ray diagram of a tri-lens system 900, in which a third, weaker lens placed behind the previously disclosed dual lens system for increasing the distance "a." In the embodiment depicted, the objective lens (OL) and objective mini-lens (OM) have been relabeled as OL1 and OL2, respectively, while the third lens is designated as OL3.

As shown in FIG. 9, an incident parallel beam 902 passes through the first lens OL1 and forms an initial virtual source $V_1$ at the second focal point of OL1 ($f_{2OL1}$). After the beam passes though the second lens OL2, the initial virtual source $V_1$ position is superceded by an intermediate virtual source $V_2$. Because of the relatively large distance between the first focal point of the second lens OL2 ($f_{1OL2}$) and the second focal point of the first lens OL1 ($f_{2OL1}$), the intermediate virtual source position $V_2$ does not differ too much from the initial virtual source position $V_1$. However, upon introduction of a third lens OL3, with the first focal point thereof ($f_{1OL3}$) in close proximity to the position of the intermediate virtual source $V_2$, a final virtual source $V_3$ is created at a position that is further away from OL1 and the biprism. As such, the upper limitation on the distance "a" from the dual lens system is overcome.

Figure 10:
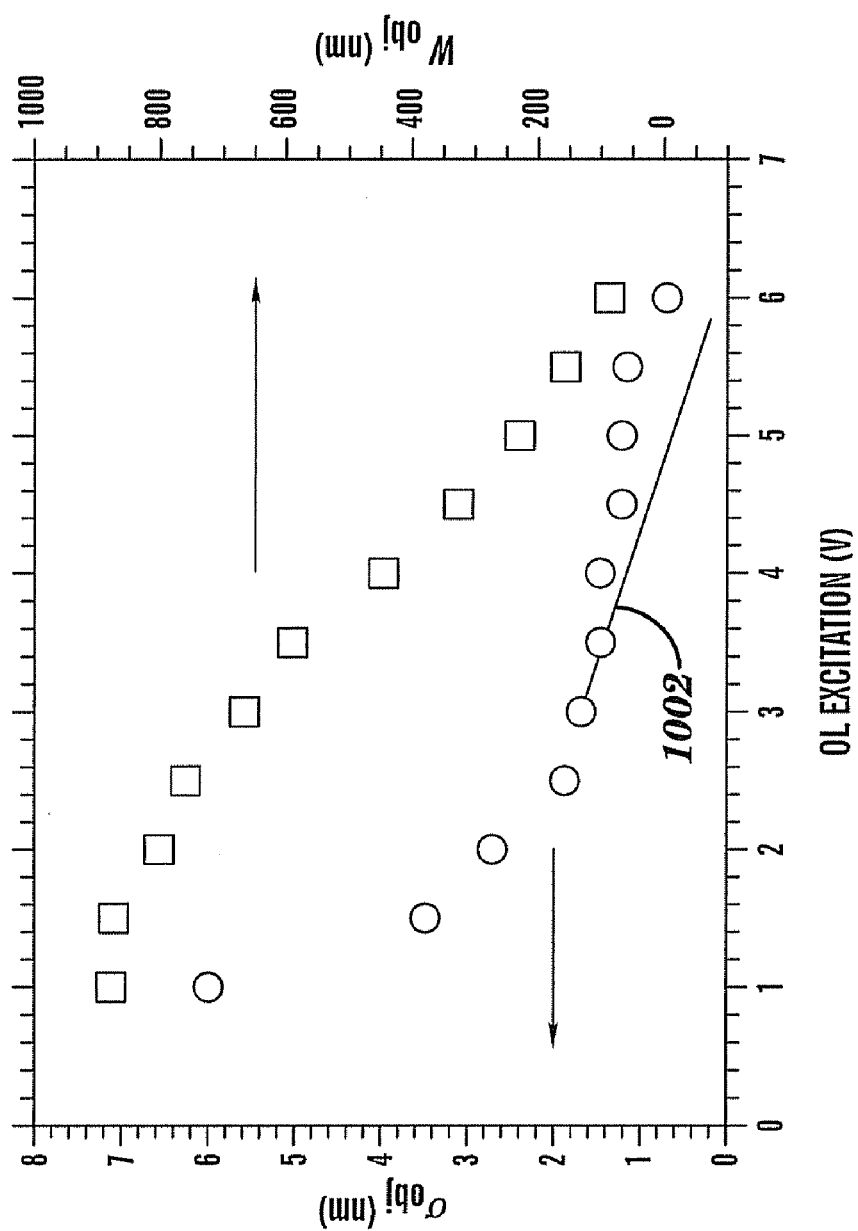
FIG. 10 is a graph that illustrates the fringe spacing and width as a function of OL lens excitation voltage at a constant biprism voltage (20V), and including projected performance of the tri-lens system at OL voltages exceeding 3.0 volts.
Figure 11:
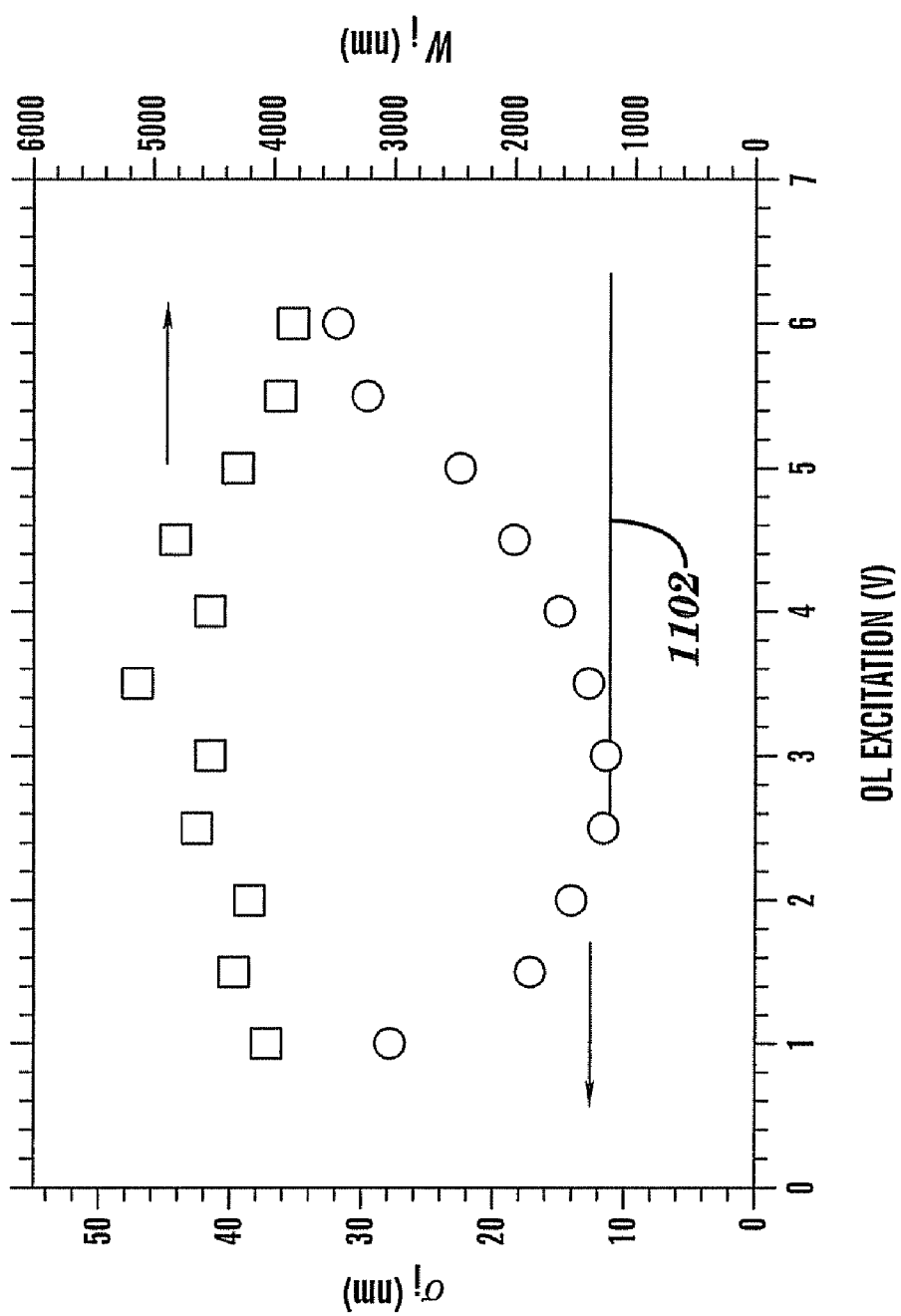
FIG. 11 is a graph that illustrates the fringe spacing and width at the image plane ($\sigma_i$ and $W_i$) as a function of OL excitation at a constant biprism voltage (20V), and including projected performance of the tri-lens system at OL voltages exceeding 3.0 volts.

Moreover, because of the relatively long focal length of OL3 (i.e., a weaker lens), the change in the final imaging position is minimal (moving up slightly and being slightly smaller). Therefore, as a practical matter, the addition of third lens OL3 only substantially affects the illumination condition, not the image condition. Furthermore, the small change of the image position due to OL3 may be adjusted by smaller adjustment of OL2. Finally, FIGS. 10 and 11 again illustrates the fringe spacing and width as a function of OL lens excitation voltage at a constant biprism voltage (20V). As indicated by the line 1002 in FIG. 10, the use of OL3 now allows fringe spacing to continue to decrease down to about the 0.1 nm region as the voltage of OL1 increases above 3.0 volts. Correspondingly, the horizontal line 1102 in FIG. 11 illustrates that the fringe spacing at the image plane does not again increase as the voltage of OL1 increases above 3.0 volts, due to the presence of OL3.

The function of the third "weak" lens OL3 can perhaps be further understood so as to bend the incident beam "more parallel" than would be the case using just through the original dual lens system, when the intermediate virtual source $V_2$ moves closer to the biprism as the OL excitation voltage is increased above 3.0 volts. The more parallel the beam illumination is, the further away the final virtual source $V_3$ is from the biprism. In a conventional TEM imaging system, the illumination lenses are located before the sample and the imaging lens with respect to the electron beam. Therefore, to change the illumination condition (such as parallel beam illumination), the lenses located before the sample are used, whereas the imaging lenses located after the sample are used to change the magnification in a conventional system.

However, in the electron holography setting of the present invention embodiments (wherein illumination and imaging conditions are to be projected onto a biprism), the magnification of the image is determined by the first two lenses (OL1 and OL2) downstream from the sample, while the illumination is determined by the third lens, OL3, to compensate for the effect of OL1 and OL2. Such an arrangement is in contrast with conventional systems, due to the fact that holographic imaging condition results from the projection of the imaging system onto the biprism by the imaging lenses located between the sample and the biprism. In other words, the lens functioning of the present system is reversed with respect to conventional systems, since the illumination lens (OL3) is located at the bottom of the lens stack.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for enhancing spatial resolution of a transmission electron microscopy (TEM) system configured for electron holography, the method comprising:
   configuring a first lens to form an initial virtual source with respect to an incident parallel beam, said initial virtual source positioned at a back focal plane of said first lens;
   configuring a second lens to form an intermediate virtual source with respect to said incident parallel beam, the position of said intermediate virtual source being dependent upon a focal length of said first lens and a focal length of said second lens; and
   configuring a third lens to form a final virtual source with respect to said incident parallel beam, wherein said third lens has a focal length such that a front focal plane of said third lens lies beyond the position of said intermediate virtual source, with respect to a biprism location.

2. The method of claim 1, wherein said front focal plane of said third lens lies immediately beyond the position of said intermediate virtual source.

3. The method of claim 2, wherein the position of said final virtual source lies beyond a front focal plane of said first lens.

4. The method of claim 1, wherein a fringe spacing generated by said first, second and third lenses is less than about 0.1 nanometers.

5. The method of claim 1, further comprising independently varying fringe spacing and fringe width with respect to fringe contrast.

6. The method of claim 1, wherein said first and said second lenses are configured so as to adjust the magnification of an image generated by the TEM system, and said third lens is configured so as to adjust the illumination of said image.

7. A method for creating an image of a sample object using a transmission electron microscopy (TEM) system configured for electron holography, the method comprising:
   configuring a first lens to form an initial virtual source with respect to an incident parallel electron beam, said initial virtual source positioned at a back focal plane of said first lens;
   configuring a second lens to form an intermediate virtual source with respect to said incident parallel electron beam, the position of said initial intermediate virtual source being dependent upon a focal length of said first lens and a focal length of said second lens;
   configuring a third lens to form a final virtual source with respect to said incident parallel electron beam, wherein said third lens has a focal length such that a front focal plane of said third lens lies beyond the position of said intermediate virtual source, with respect to a biprism location; and
   applying a voltage to said biprism so as to focus a holographic image on an image plane.

8. The method of claim 7, wherein said front focal plane of said third lens lies immediately beyond the position of said intermediate virtual source.

9. The method of claim 8, wherein the position of said final virtual source lies beyond a front focal plane of said first lens.

10. The method of claim 7, wherein a fringe spacing generated by said first, second and third lenses is less than about 0.1 nanometers.

11. The method of claim 7, further comprising independently varying fringe spacing and fringe width with respect to fringe contrast.

12. The method of claim 7, wherein said first and said second lenses are configured so as to adjust the magnification of said holographic image generated by the TEM system, and said third lens is configured so as to adjust the illumination of said holographic image.

13. A system for enhancing spatial resolution of a transmission electron microscopy (TEM) system configured for electron holography, comprising:
   a first lens configured to form an initial virtual source with respect to an incident parallel beam, said initial virtual source positioned at a back focal plane of said first lens;
   a second lens configured to form an intermediate virtual source with respect to said incident parallel beam, the position of said intermediate virtual source being dependent upon a focal length of said first lens and a focal length of said second lens; and
   a third lens configured to form a final virtual source with respect to said incident parallel beam, wherein said third lens has a focal length such that a front focal plane of said third lens lies beyond the position of said intermediate virtual source, with respect to a biprism location.

14. The system of claim 13, wherein said front focal plane of said third lens lies immediately beyond the position of said intermediate virtual source.

15. The system of claim 14, wherein the position of said final virtual source lies beyond a front focal plane of said first lens.

16. The system of claim 13, wherein a fringe spacing generated by said first, second and third lenses is less than about 0.1 nanometers.

17. The system of claim 13, wherein said first, said second and said third lenses are configured for independent adjustment of fringe spacing and fringe width with respect to fringe contrast.

18. The system of claim 13, wherein said first and said second lenses are configured so as to adjust the magnification of an image generated by the TEM system, and said third lens is configured so as to adjust the illumination of said image.

* * * * *